Figure 1:
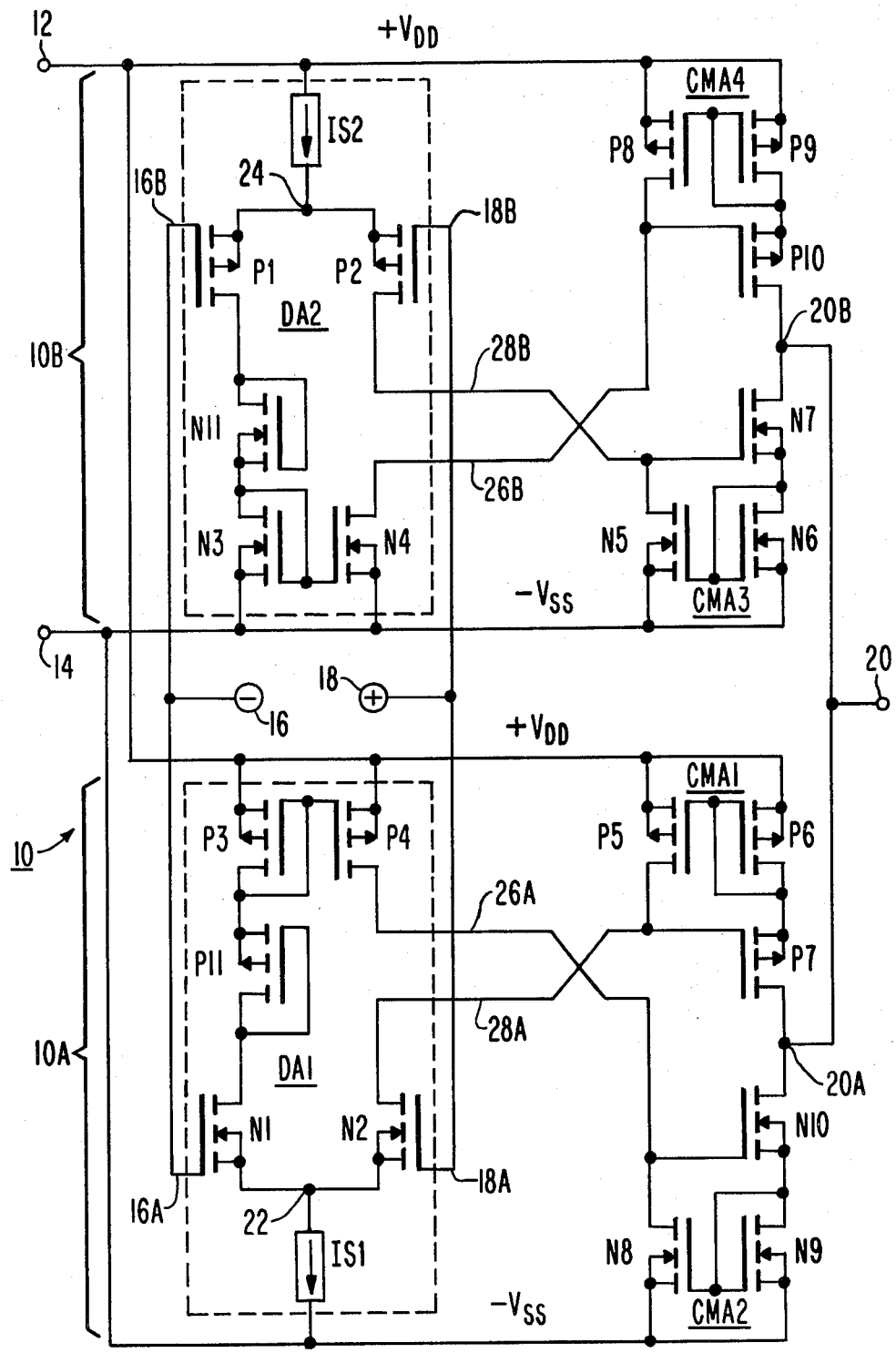
Figure 2:
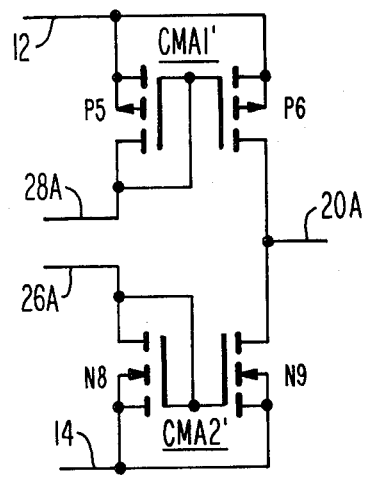

United States Patent [19]

Hoover

[11] 4,377,789

[45] Mar. 22, 1983

[54] OPERATIONAL AMPLIFIER EMPLOYING COMPLEMENTARY FIELD-EFFECT TRANSISTORS

[75] Inventor: Merle V. Hoover, Flemington, N.J.

[73] Assignee: RCA Corporation, New York, N.Y.

[21] Appl. No.: 246,027

[22] Filed: Mar. 20, 1981

[51] Int. Cl.³ .......................... H03G 3/00; H03F 3/45
[52] U.S. Cl. ..................................... 330/253; 307/529; 328/160; 330/254; 330/257; 330/258; 330/264
[58] Field of Search ............... 330/253, 254, 257, 258, 330/264; 307/529; 328/160

[56] References Cited

U.S. PATENT DOCUMENTS

| | | | |
|---|---|---|---|
| 3,737,797 | 6/1973 | Amemiya | 330/261 |
| 3,786,179 | 01001974 | Mouri et al. | /178 |
| 3,921,090 | 11/1975 | Wheatley et al. | 330/257 |
| 4,004,245 | 1/1977 | Ochi et al. | 330/253 |
| 4,048,575 | 9/1977 | Musa | 330/257 X |
| 4,152,663 | 5/1979 | Van de Sande | 330/253 |
| 4,267,517 | 5/1981 | Iida et al. | 330/253 |

OTHER PUBLICATIONS

Linear Integrated Circuit D.A.T.A. Book, Edition 23, 1980, See A358, p. 188.
H. Wittlinger, "Applications of the CA3080 and CA3080A High–Performance Operational Transconductance Amplifiers", Application Note ICAN-6668, RCA Solid State Division, 1972.

Primary Examiner—James B. Mullins
Attorney, Agent, or Firm—E. M. Whitacre; P. J. Rasmussen; C. A. Berard, Jr.

[57] ABSTRACT

An operational amplifier employing complementary MOSFET transistors includes first and second differential amplifiers respectively employing complementary conductivity type transistors. The input connections of the first and second differential amplifiers connect in parallel to receive the same input signal, the common-mode voltage of which may vary to and include first and second supply potentials. First and second current mirror amplifiers, respectively employing complementary conductivity type transistors, have input connections to which first and second output connections of the first differential amplifier respectively connect, and have output connections connected to an output terminal. Third and fourth current mirror amplifiers, respectively employing complementary conductivity type transistors, have input connections to which first and second output connections of the second differential amplifier respectively connect, and have output connections connected to the output terminal.

14 Claims, 7 Drawing Figures

OPERATIONAL AMPLIFIER EMPLOYING COMPLEMENTARY FIELD-EFFECT TRANSISTORS

This invention relates to operational amplifiers and, in particular, to such amplifiers employing complementary field-effect transistors (FETs).

Operational amplifiers desirably exhibit high gain, high input resistance and accept differential-input signals having a wide range of common-mode input voltage, i.e., the instantaneous algebraic average of two input signals applied to a balanced circuit, both signals referred to a common reference. Operational amplifiers are described in "Integrated-Circuit Operational-Amplifiers Configuration", *RCA Linear Integrated Circuits,* Technical Series IC-41, 1967, pages 73–112, incorporated herein by reference for that purpose. In a particular type of operational amplifier known as an operational transconductance amplifier (OTA), high output resistance is also provided. The gain of an OTA is characterized in terms of a transconductance, that is the ratio of the change of output current in response to a change of input voltage. OTAs are described by H. A. Wittlinger, ICAN-6668, "Applications of the CA3080 and CA3080A High Performance Operational Transconductance Amplfiers", 1972, reprinted in *RCA Linear Integrated Circuits,* SSD-240A, 1978, pages 538–45, incorporated herein by reference for that purpose.

The amplifier circuit of the present invention can readily be made to exhibit satisfactory operation over a range of common-mode input voltages including those at and slightly beyond its supply voltages. It desirably employs a pair of differential-input amplifiers of complementary conductivity type within a highly symmetrical circuit structure to obtain similar operating characteristics substantially independently of operating voltages and currents, operating temperature, and variations in integrated circuit (IC) processing.

According to the present invention, an operational amplifier circuit comprises first and second input terminals, an output terminal, and first and second supply terminals for receiving operating potential. It employs first and second differential amplifiers of first and second complementary conductivity types, respectively, each having first and second input connections to which the first and second input terminals respectively connect, and each having first and second output connections. It further employs first and second current mirror amplifiers of the second and first conductivity types respectively, each having an output connection to which the output terminal connects, a respective common connection to which the first and second supply terminals respectively connect, and a respective input connection to which the second and first output connections of the first differential amplifier respectively connect. Additionally, third and fourth current mirror amplifiers of the first and second conductivity types, respectively, each having an output connection to which the output terminal connects, a respective common connection to which the second and first supply terminals respectively connect, and a respective input connection to which the second and first output connection of the second differential amplifier respectively connect.

Figure 4:
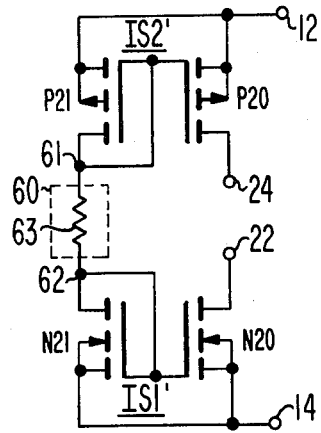
Figure 5:
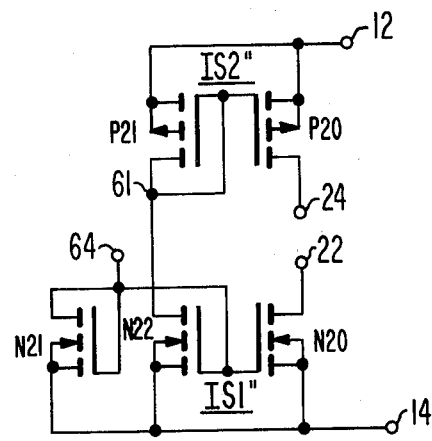
Figure 6:
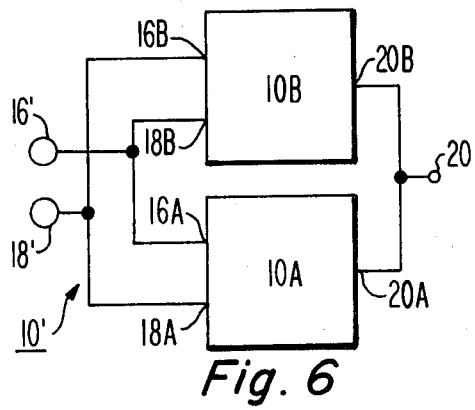

In the drawings:

FIGS. 1 and 6 are schematic diagrams of embodiments of the present invention; and FIGS. 2, 3, 4, 5, and 7 are schematic diagrams of alternative embodiments of portions of the amplifiers of FIGS. 1 and 6.

Operational amplifier 10 of FIG. 1 receives input signals at input terminals 16 and 18, supplies amplified output signals at output terminal 20, and receives relatively positive operating potential $+V_{DD}$ from supply terminal 12 and relatively negative operating potential $-V_{SS}$ from suppy terminal 14. Amplifier 10 comprises a pair of parallelly connected amplifiers 10A and 10B of like circuit configuration and of complementary conductivity type to each other, having their respective input connections 16A and 16B connected to input terminal 16, their respective input connections 18A and 18B connected to input terminal 18, and their respective output connections 20A and 20B connected to output terminal 20.

As used herein, the conductivity type of a functional group of circuit elements is the same as the conductivity type of the principal transistors used therein. For example, CMA1, which employs P-channel FETs P5, P6 and P7 would be referred to as a P-conductivity CMA. Thus, CMA2 would be referred to as an N-conductivity CMA, the conductivity type thereof being complementary to that of CMA1. Similarly, differential amplifier DA1 is of N-conductivity type corresponding to that of the differential amplifier formed by FETs N1 and N2, and DA2 is of P-conductivity type corresponding to that of FETs P1 and P2. DA2 is therefore of complementary conductivity to that of DA1.

In amplifier 10A, differential amplifier DA1 includes N-channel enhancement-mode FETs N1 and N2 having their respective sources connected together at node 22 to receive operating current from current supply IS1 and having their respective gates connected to receive input signals from input connections 16A and 18A. P-channel enhancement-mode FETs P3 and P4 are connected to form a current mirror amplifier (CMA) with their sources connected in common to supply terminal 12 and the drain of P3 connected to the gates of P3 and P4 to apply potential to condition them for conduction in response to drain current demand from FET N1 connected through P11, the purpose of which is explained below. Drain current from FET P4 is conducted to output connection 26A of differential amplifier DA1 while drain current of FET N2 is conducted from output connection 28A of DA1.

P-channel enhancement-mode FETs P5, P6, and P7 are connected to form a current mirror amplifier CMA1 receiving input current from output connection 28A at its input connection at the drain of P5 and supplying output current from the drain of P6. Drain current of P6 is coupled by the source-drain conduction path of P7 to output connection 20A. The sources of P5 and P6 connect together and to supply terminal 12 to serve as a common connection for CMA1. Potential from the drain of P5 is applied by source-follower action of P7 to the gates of P5 and P6 to condition them for conduction.

Similarly, N-channel enhancement-mode FETs N8, N9 and N10 are connected to form CMA2 receiving input current from output connection 26A of DA1 at the drain of N8 and supplying output current from the drain of N9. Drain current of N9 is coupled by the source-drain conduction path of N10 to output connection 20A. The sources of N8 and N9 connect together and to supply terminal 14 to serve as a common connection of CMA2. Potential at the drain of N8 is applied by the source-follower action of N10 to the gates of N8 and N9 to condition them for conduction.

It is noted that FET P7 serves as a common-gate amplifier with respect to the drain-source current of P6 so to increase the resistance exhibited at output connection 20A to a value substantially above that which would be exhibited if P6 were to be directly connected to 20A. Similarly, FET N10 serves as a common-gate amplifier with respect to the source-drain current of N9 to also increase the resistance exhibited at output connection 20A to a value substantially above that which would be exhibited if N9 were to be directly connected to 20A. High resistance at output connection 20A is particularly desirable where amplifier 10 is to be employed as an OTA so that its output is substantially a current source or sink for its load.

It is noted that the quiescent potential at the drain of N2 is negative with respect to $+V_{DD}$ by two gate-source operating potentials $V_{GS}$, i.e., those of P6 and P7. So that the quiescent potential at the drain of N1 is the same as that of N2, diode-connected P-channel, enhancement-mode FET P11 is connected between the respective drains of P3 and N1. Thus, the drain potential of N1 is negative with respect to $+V_{DD}$ by the sum of the $V_{GS}$s of P3 and P11.

Differential amplifier DA2 differs from DA1 in two respects. Firstly, N-channel FETs are replaced by P-channel FETs and P-FETs are replaced by N-FETs (e.g. N1 and N2 replaced by P1 and P2 and so forth). Secondly, the operating supplies are of opposite polarity (e.g., operating current from current supply IS2 flows from supply terminal 12 to source interconnection 24 and is oppositely poled from operating current flowing in current supply IS1 from source interconnection 22 to supply terminal 14). In like manner, CMA3 corresponds to CMA1 and CMA4 corresponds to CMA2. Correspondingly numbered transistors, e.g., N3 and P3, and P10 and N10, are similarly connected to perform similar functions as between amplifiers 10B and 10A, respectively.

Amplifiers 10A and 10B supply output signals at terminal 20 that reinforce each other in response to input signals applied between terminals 16 and 18. When input signals are applied so that the potential of terminal 18 is more positive than that at terminal 16, N2 conducts more heavily than does N1. As a result, P6 and P7 conduct more heavily than do N9 and N10. Thus, for amplifier 10A, the current flow from supply terminal 12 to output terminal 20 increases relative to that flowing from terminal 20 to supply terminal 14. In amplifier 10B, that same input signal also causes P1 to conduct more heavily than P2 which in turn causes P9 and P10 to conduct more heavily than do N6 and N7. As a result, the current flowing from supply terminal 12 to output terminal 20 via amplifier 10B is also increased to reinforce the current supplied by amplifier 10A. When the input signals are of opposite polarity to that just described, current flowing from supply terminal 12 to output terminal 20 decreases relative to that flowing from terminal 20 to terminal 14 in each of amplifiers 10A and 10B.

Amplifiers 10A and 10B complement each other so that satisfactory operation may obtain when common-mode voltages at input terminals 16 and 18 are at or beyond supply potentials $V_{DD}$ and $V_{SS}$. N-FETs, such as N1 or N2, function as amplifiers so long as their drains are slightly positive with respect to their sources and so long as their gate-source voltages $V_{GS}$ are of sufficient positive magnitude, typically 1-2 volts. P-channel FETs exhibit similar characteristics when the polarity of their potentials is reversed.

When the common-mode potential $V_{CM}$ at terminals 16 and 18 is in a range between supply potentials $+V_{DD}$ and $-V_{SS}$, both amplifiers 10A and 10B function together as described above responsive to input differential-mode signals in supplying current to output terminal 20.

When $V_{CM}$ closely approaches or becomes positive with respect to $+V_{DD}$, amplifier 10A remains operatively responsive to input signals at terminals 16 and 18 for supplying output signals at terminal 20. In that case, amplifier 10B becomes sluggish (i.e. suffers reduced gain) and tends to be non-responsive to input signals when $V_{CM}$ is so relatively positive. In complementary fashion, when $V_{CM}$ closely approaches or becomes negative with respect to $-V_{SS}$, amplifier 10B remains operatively responsive while amplifier 10A becomes sluggish or non-responsive. Thus, amplifiers 10A and 10B cooperate so that amplifier 10 is operatively responsive to input signals between terminals 16 and 18 when the common-mode signal thereat approaches or slightly exceeds either of its supply potentials.

When the input common-mode potential closely approaches supply voltage, $+V_{DD}$, the performance of DA2 will deteriorate because increasingly there is insufficient voltage between supply terminal 12 and the gates of P1 and P2 to permit them to function efficiently as amplifying transistors. Thus, little current will be contributed at output terminal 20 via the N6, N7 or P9, P10 current paths.

FETs N1 and N2 of DA1 receive sufficient gate-source and drain-source potential to function as amplifiers when, in the limit, $$V_{16} \leq V_{DD} - [(V_{GS-P3} + V_{GS-P11} + V_{DS-N1}) - V_{GS-N1}] \tag{1a}$$

and $$V_{18} \leq V_{DD} - [(V_{GS-P6} + V_{GS-P7} + V_{DS-N2}) - V_{GS-N2}] \tag{1b}$$

where the gate-source voltages $V_{GS}$ are the operating voltages for amplifying action and where the drain source voltage $V_{DS}$ is the minimum voltage therefor. As can be seen from equation (1a), when $V_{GS-N1}$ is larger than $(V_{GS-P3} + V_{GS-P11} + V_{DS-N1})$, the bracketed term is negative. Thus, satisfactory operation of amplifier 10A will obtain when the potential at terminal 16 equals or exceeds that at supply terminal 12. A similar relationship holds for N2, P6 and P7 with respect to terminal 18, as is shown by equation (1b). Owing to the highly symmetrical, but complementary, structure of amplifiers 10A and 10B, complementary relationships hold for terminals 16 and 18 with respect to $-V_{SS}$ and amplifier 10B.

So that the bracketed terms of equations (1a) and (1b) will be negative the structures and characteristics of the FETs comprising amplifiers 10A and 10B are selected in a particular manner. For example, with respect to amplifier 10A, N1 is constructed so as to exhibit a higher $V_{GS}$ than do P3 and P11, at a given drain current level, to obtain the desired result for terminal 16. Similarly, N2 is of like construction to N1, and P5, P6, P7 are of like construction to P3 and P11 so that the desired result obtains for terminal 18 as well. This is accomplished by tailoring the $V_{GS}$ threshold voltages by selecting the size (channel area) of N1 and N2 to be smaller than that of the P-FETs just mentioned, or by increasing the doping levels of those P-FETs so that they tend to operate more towards depletion mode. It is understood that complementary adjustments to the FETs in amplifier 10B are also made so that P1 and P2 operate as amplifiers when the potentials at terminals 16 and 18 closely approach $-V_{SS}$, under which condition DA1 becomes less efficient.

Further expansion of the input voltage range obtains when fewer devices are employed. For example: FETs P11 and N11 can be omitted and replaced by short-circuits; CMAs 1 and 2 of FIG. 1 can be replaced by simplified CMA's 1' and 2' of FIG. 2; and CMA's 3 and 4 can be replaced by CMA's of like configuration to CMA's 1' and 2'. In that case, $$V_{16} \leq V_{DD} - [(V_{GS-P3} + V_{DS-N1}) - V_{GS-N1}] \quad (2a)$$

and $$V_{18} \leq V_{DD} - [(V_{GS-P5} + V_{DS-N2}) - V_{GS-N2}] \quad (2b)$$

hold for terminals 16 and 18 and amplifier 10A while complementary relationships hold for amplifier 10B.

Figure 3:
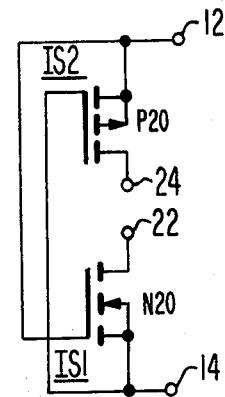

FIG. 3 is an embodiment of current supplies IS1 and IS2 wherein drain current from complementary conductivity, enhancement-mode FETs N20 and P20 is supplied to source connections 22 and 24, respectively. The sources of FETs N20 and P20 connect to supply terminals 14 and 12, respectively, while their gates connect to opposite supply terminals 12 and 14, respectively, for making them operate as substantially constant current sources. When the current sources of FIG. 3 are used in conjunction with the amplifier of FIG. 1, an extremely simplified amplifier, requiring no resistors, results. The advantage of such amplifiers is two-fold—firstly, the large area requirements of integrated circuit resistors and the difficulty of obtaining stable resistance values are avoided. Secondly, in a monolithic integrated circuit embodiment, the reduced complexity and chip area results in lower costs and higher production yields.

In FIG. 4, FETs N21 and P21 cooperate with N20 and P20 to form CMAs serving as IS1' and IS2', respectively. Operating currents supplied to source connections 22 and 24 are proportionally related by the CMA action of IS1' and IS2' to the current flow in element 60. That current is determined by the operating potential between supply terminals 12 and 14 and the conductance characteristics of element 60, for example, those of resistor 63. Element 60 could be a controlled conductance device, for example, a control FET with its drain-source conduction path connected between input connections 61 and 62 whereby the operating currents are responsive to the signals applied to the gate of that control FET.

In FIG. 5, a control signal applied at connection 64 causes FETs N20, N21 and N22, connected as CMA IS1", to supply operating current from the drain of N20 to source connection 22 and a related current from the drain of N22 in input connection 61. CMA IS2", formed by FETs P20 and P21, then supplies a related operating current to source connection 24. Due to the symmetry of the circuits described, one could, of course interchange N and P-channel devices and the polarity of operating potentials so that the control signal would be applied to IS2" directly while IS1" is responsive to a further output current from IS2".

When current supplies IS1" and IS2" in accordance with FIG. 5 are employed, the amplifier 10 of FIG. 1 is usable as a variable gain amplifier, i.e., variable transconductance for an OTA. The gain exhibited between input terminals 16, 18 and output terminal 20 is proportional to the control signal current applied to terminal 64. As a result, the amplifier can be employed as an amplitude modulator wherein the differential signal at terminals 16, 18 is modulated by the signals applied at control terminal 64. Furthermore, selective application of control current to terminal 64 can effectively provide gating of the signal paths between terminals 16, 18 and 20. Similar results obtain when element 60 of FIG. 3 is a control FET as described above.

Amplifier 10' of FIG. 6 differs from amplifier 10 of FIG. 1 in that input connections 16A and 18B of amplifiers 10A and 10B, respectively, connect to input terminal 16', and input connections 16B and 18A of amplifiers 10B and 10A, respectively, connect to input terminal 18'. That difference causes the currents supplied at output connections 20A and 20B responsive to signals applied between terminals 16' and 18' to tend to oppose each other.

For example, when terminal 16' becomes relatively negative with respect to terminal 18', current flow in N2 and CMA 1 of amplifier 10A increases relative to that in N1 and CMA2 whereby increased output current flows from 20A towards 20. However, in amplifier 10B, P2 and CMA 3 conduct more heavily than do P1 and CMA 4 whereby increased output current flows from 20 towards 20B, i.e. in opposite sense to that from amplifier 10A. When opposite polarity signals are applied between terminals 16 and 18, opposite current flows occur. When the currents supplied by IS1 and IS2 are equal, the output currents just described tend to cancel so that no net current change occurs at terminal 20 as a result of signals applied between 16' and 18'.

Figure 7:
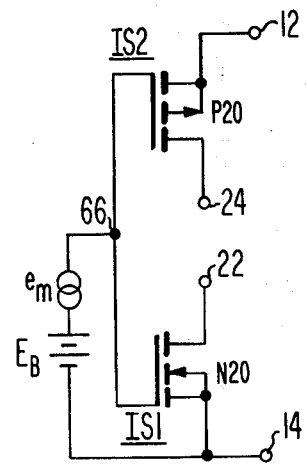

That result is especially useful when current supplies IS1 and IS2 are of the sort shown in FIG. 7. Operating currents supplied by FETs N20 and P20 to source connections 22 and 24, respectively, are responsive to the control potential applied at control node 66. That control potential could include a fixed portion $E_B$ and a variable portion $e_m$. $E_B$ is ordinarily selected so that the quiescent potential at node 66 is midway between $+V_{DD}$ and $-V_{SS}$ at terminals 12 and 14, respectively. When $V_{DD}$ and $V_{SS}$ are of equal magnitude but opposite polarity, node 66 is quiescently at ground potential, and IS1 and IS2 tend to supply currents of equal magnitude.

When the potential at control node 66 moves towards $+V_{DD}$ at terminal 12, operating current supplied by P20 at connection 24 decreases and operating current supplied by N20 at connection 22 increases in complementary manner. As a result, the current flows in N1, N2, CMA1 and CMA2 of amplifier 10A all increase while those in P1, P2, CMA3 and CMA4 all decrease. The net effect is a tendency to cancel changes in the current flowing from terminals 20A, 20B and, therefore, that at terminal 20. When the potential at connection 66 moves towards $-V_{SS}$, opposite current flows are developed. When terminals 16' and 18' are at the same potential, the opposing current flows are substantially equal so that no net current change occurs at terminal 20 as a result of signals applied at node 66.

Thus, amplifier 10' of FIG. 6 including the bias circuit of FIG. 7 functions as a four-quadrant analog multiplier. For example, with $+V_{DD}=+10$ volts and $-V_{SS}=-10$ volts, a first input signal X is applied between terminals 16' and 18', a second input signal Y is applied between node 66 and a ground reference potential, and an output signal proportional to the product XY is developed at terminal 20. Where one of signals X and Y is a carrier signal and the other is a modulation signal, the resultant signals at terminal 20 are the sidebands of a suppressed-carrier modulated signal.

In a preferred embodiment of the invention, it is desirable that transistors serving like functions exhibit similar transconductance characteristics, for example, FETs P1 and P2 of DA2 are preferably matched as are FETs N1 and N2 of DA1. Similar matching is desirable between FETs N3 and N4 and FETs P3 and P4. It is further preferred that complementary FETs also exhibit similar transconductance characteristics, for example, as between FETs P1, P2, N1 and N2, or as between FETs N20 and P20 in the current sources of FIGS. 3–5 and 7. Matching the transconductance characteristics of the respective FETs can be readily achieved when circuits embodying the invention are constructed using an integrated circuit technology such as metal-oxide semiconductor, field-effect transistor (MOS-FET) technology.

Modifications of the described embodiments are contemplated to be within the scope of the present invention which is limited only by the claims following. For example, CMAs 1, 2, 3 and 4 may be implemented using alternative forms of CMAs known to those skilled in the art. Furthermore, each differential-input amplifier stage could employ cascode-connected further transistors in the respective drain circuits of FETs N1, N2, P1 and P2 for substantially increasing their output resistance and thereby substantially increasing their voltage gain.

What is claimed is:

1. An operational amplifier circuit comprising:
   first and second input terminals and an output terminal;
   first and second supply terminals for receiving operating potential;
   first and second differential amplifying means of first and second complementary conductivity types, respectively, each having first and second input connections to which said first and second input terminals respectively connect, and each having first and second output connections;
   first and second current mirror amplifying means of said second and first conductivity types, respectively, each having an output connection to which said output terminal connects, each having a respective common connection to which said first and second supply terminals respectively connect, and each having a respective input connection to which the second and first output connections of said first differential amplifying means respectively connect; and
   third and fourth current mirror amplifying means of said first and second conductivity types, respectively, each having an output connection to which said output terminal connects, each having a respective common connection to which said second and first supply terminals respectively connect, and each having a respective input connection to which the second and first output connections of said second differential amplifying means respectively connect.

2. The amplifier circuit of claim 1 wherein said first differential amplifying means comprises:
   first and second transistors of said first conductivity type, having respective input electrodes serving as the first and second input connections of said first differential amplifying means, having respective output electrodes, the output electrode of said second transistor serving as the second output connection of said first differential amplifying means, and having respective common electrodes connected together for receiving a first operating current;
   means for applying said first operating current; and
   current amplifying means having an input connection to with the output electrode of said first transistor connects, and having an output connection serving as the first output connection of said first differential amplifying means.

3. The amplifier circuit of claim 2 wherein said current amplifying means comprises:
   third and fourth transistors of said second conductivity type each having an input electrode, each having a common electrode connected to said first supply terminal, said third transistor having an output electrode serving as the input connection of said current amplifying means and said fourth transistor having an output electrode serving as the output connection thereof; and
   means for applying a potential responsive to potential at the input connection of said current amplifying means to the respective input electrodes of said third and fourth transistors to condition them for conduction.

4. The amplifier circuit of claim 2 wherein said second differential amplifying means comprises:
   first and second further transistors of said second conductivity type, having respective input electrodes serving as the first and second input connections of said second differential amplifying means, having respective output electrodes, the output electrode of said second further transistor serving as the second output connection of said second differential amplifying means, and having respective common electrodes connected together for receiving a second operating current;
   means for applying said second operating current; and further current amplifying means having an input connection to which the output electrode of said first further transistor connects, and having an output connection serving as the first output connection of said second differential amplifying means.

5. The amplifier circuit of claim 4 wherein
   said means for applying said first operating current includes first current supply means connected between the connection of the common electrodes of said first and second transistors and said second supply terminal for supplying said first operating current responsive to a first control signal; and wherein
   said means for applying said second operating current includes second current supply means connected between the connection of the common electrodes of said first and second further transistors and said first supply terminal for supplying said second operating current responsive to a second control signal.

6. The amplifier circuit of claim 5 further including means for generating said first and second control signals to maintain a proportional relationship between said first and second operating currents.

7. The amplifying circuit of claim 5 wherein said first current supply means includes fifth current mirror amplifying means, having a first output circuit for supplying the first operating current, and having an input circuit to which the first control signal is applied; and said second current supply means includes sixth current mirror amplifying means having a first output circuit for supplying the second operating current and having an input circuit to which the second control signal is applied.

8. The amplifying circuit of claim 7 further including means connected between the respective input circuits of said fifth and sixth current mirror amplifying means for generating the first and second control signals by conducting current therebetween.

9. The amplifying circuit of claim 7 wherein one of said fifth and sixth current mirror amplifying means includes a further output circuit which connects to the input circuit of the other of said fifth and sixth current mirror amplifying means for applying the corresponding one of the first and second control signals thereto.

10. The amplifying circuit of claim 5 further including means for generating the first and second control signals to maintain a complementary relationship between the first and second operating currents.

11. The amplifying circuit of claim 10 wherein:

said first current supply means includes a first control transistor of said first conductivity type having an output electrode connected for supplying said first operating current, having a common electrode connected to said second supply terminal, and having an input electrode;

said second current supply means includes a second control transistor of said second conductivity type having an output electrode connected for supplying said second operating current, having a common electrode connected to said first supply terminal, and having an input electrode; and said means for generating the first and second control signals includes a control node for receiving a control potential thereat, and means connecting the respective input electrodes of said first and second control transistors to said control node.

12. The amplifying circuit of claim 11 wherein said control potential includes a fixed potential component and a variable potential component, said fixed potential component tending to maintain the first and second operating currents at a quiescent level, and said variable potential component tending to vary said first and second operating currents in said complementary relationship.

13. The amplifying circuit of claim 1 wherein each of said first, second, third and fourth current mirror amplifying means respectively comprises:

first and second transistors of the same conductivity type as the particular current mirror amplifying means with which they are associated, each having a common electrode connected to the common connection thereof, each having an input and an output electrode, the output electrode of said first transistor serving as the input connection of said particular current mirror amplifying means;

means for coupling the output electrode of said second transistor to the output connection of said particular current mirror amplifying means; and means for applying a potential responsive to potential at the input connection of said particular current mirror amplifying means to the respective input electrodes of said first and second transistors to condition them for conduction.

14. The amplifier circuit of claim 13 wherein said means for coupling and said means for applying together include:

a third transistor of said same conductivity type, having an input electrode connected to the input connection of said particular current mirror amplifying means and having an output electrode connected to the output connection thereof, and having a common electrode connected to the output electrode of said second transistor; and means for applying the potential at the common electrode of said third transistor to the input electrodes of said first and second transistors.

* * * * *